United States Patent
Nakamura et al.

(10) Patent No.: US 6,784,538 B2
(45) Date of Patent: Aug. 31, 2004

(54) HEAT TRANSFER STRUCTURE FOR A SEMICONDUCTOR DEVICE UTILIZING A BISMUTH GLASS LAYER

(75) Inventors: Takayoshi Nakamura, Hitachi (JP); Ryuichi Saito, Hitachi (JP); Akihiro Tamba, Hitachinaka (JP); Takashi Naitou, Mito (JP); Hiroki Yamamoto, Hitachi (JP); Takashi Namekawa, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 234 days.

(21) Appl. No.: 10/209,255

(22) Filed: Jul. 30, 2002

(65) Prior Publication Data

US 2003/0025196 A1 Feb. 6, 2003

Related U.S. Application Data (63) Continuation of application No. 10/102,001, filed on Mar. 18, 2002.

(30) Foreign Application Priority Data

Aug. 1, 2001  (JP) ........................................ 2001-233856

(51) Int. Cl.[7] .......................... H01L 23/34; H01L 21/48
(52) U.S. Cl. ........................ 257/707; 257/713; 257/717; 257/720; 257/783; 438/122; 361/709; 361/711
(58) Field of Search ................................. 257/706, 707, 257/712, 713, 717, 720, 782, 73; 438/118, 121, 122, 123; 361/688, 704, 709–711

(56) References Cited

U.S. PATENT DOCUMENTS

| | | | |
|---|---|---|---|
| 5,157,014 A | 10/1992 | Shi | 505/450 |
| 5,182,632 A | 1/1993 | Bechtel et al. | 257/713 |
| 5,256,469 A | 10/1993 | Cherukuri et al. | 428/210 |
| 5,277,724 A | 1/1994 | Prabhu | 156/89.16 |
| 6,291,880 B1 | 9/2001 | Ogawa et al. | 257/723 |
| 6,479,323 B1 | 11/2002 | Lo et al. | 438/111 |
| 6,486,548 B1 | 11/2002 | Nakatsu et al. | 257/690 |

FOREIGN PATENT DOCUMENTS

| | | | |
|---|---|---|---|
| GB | 2 109 997 | 6/1983 | |
| JP | 2-094649 | 4/1990 | |
| JP | 2-100346 | 4/1990 | |
| JP | 9-097865 | 4/1997 | |
| JP | 9-268026 | 10/1997 | |
| JP | 2000-097865 | 4/2000 | |
| JP | 2003046041 A | * 2/2003 | .......... H01L/23/373 |

* cited by examiner

Primary Examiner—Alonzo Chambliss
(74) Attorney, Agent, or Firm—Hogan & Hartson, LLP

(57) ABSTRACT

The present invention is a semiconductor apparatus having at least a part of a semiconductor device conjugated to a metal material for heat sink via an electric insulating material, wherein said electric insulating material is a bismuth glass layer.

13 Claims, 7 Drawing Sheets

HEAT TRANSFER STRUCTURE FOR A SEMICONDUCTOR DEVICE UTILIZING A BISMUTH GLASS LAYER

This is a continuation of application Ser. No. 10/102,001 filed Mar. 18, 2002, which application is hereby incorporated by reference in its entirety.

BACKGROUND OF THE INVENTION

The present invention relates to a semiconductor device, and more particularly, to a semiconductor device suitable for power circuits, such as inverters which are used in various power electronics apparatuses.

DESCRIPTION OF THE RELATED ART

As a typical prior art structure of substrates insulated with a glass for use in semiconductor devices, Japanese Patent No. 2503778 discloses a substrate for semiconductor devices has a structure comprising a heat sink plate of copper or a copper alloy and a thin plate for forming circuits of copper or a copper alloy where the thin plate is laminated on one surface of the heat sink plate with an oxide-based glass insulating layer having a thermal expansion coefficient close to those of copper or the copper alloy interposed between the heat sink and the thin plate. The oxide-based glass insulating layer comprises a silicate glass or phosphate glass.

On the other hand, JP-A-9-97865 discloses a structure comprising a SiN substrate having a heat sink of Cu or Al adhered thereon with an active metal solder. JP-A-2-94649 discloses a structure comprising a $Al_2O_3$ substrate having a heat sink of Cu and $Cu_2O$ layer adhered thereon with a solder layer. JP-A-2000-97865 discloses an arrangement comprising a glass substrate having a base plate adhered thereon with a die paste.

The conventional structures having the oxide-based glass insulating layer as described above are as thick as 1 mm due to the glass formed on the upper concave surface of the heat sink plate. The thermal conductivity of glass is as low as 0.5 to 3 W/m.k. As the thickness of the glass is thicker, the thermal resistance of the glass part becomes higher. Therefore, the thermal resistance from the circuit-forming thin plate to the heat sink plate becomes higher. When loading a semiconductor device having a higher exothermic value, a larger heat sink is required for cooling which causes problems of an increase in the heat sink volume and added costs. Moreover, there is a problem that the structure is brittle under a stress due to the thick glass.

Another problem is that the glasses used for the conventional structure contain alkaline materials such as $Na_2O$ and $P_2O_5$ resulting in a reduction in glass's electric resistance associated with a reduction in breakdown voltage. Moreover, alkaline glasses have a lower chemical stability as compared to those of $SiO_2$ glasses and hence they are lower in reliability. An additional problem is that as they have a high melting point as high as 700° C. which is corresponding to a working temperature for adhering the glasses onto a metal, they can not be adhered to a material having a relatively low melting point, such as aluminum (660° C.). Besides those problems, there is still another problem that a reducing atmosphere is necessary for combining the glass with copper or a copper alloy because both can not be conjugated in an oxidizing atmosphere.

A structure adhered with active metal solder materials as disclosed in JP-A-97865 and that having connections formed via solder layers as disclosed in JP-A-2-94649 have both a higher heat resistance and hence require a larger heat sink for cooling when a semiconductor device having a high exothermic value is loaded, producing problems such as an increase in the heat sink volume and added costs.

Moreover, the invention of the above JP-A-2000-97865 effected an adhesion between a base plate and a $SiO_2$ glass substrate. However, the $SiO_2$ glasses have a high heat resistance and therefore requires a larger heat sink for cooling when loading very exothermic semiconductor devices.

In view of the above problems, an object of the present invention is to achieve a semiconductor apparatus which allows chip area to be made smaller using a highly effective power module for cooling.

Other objects, features and advantages of the invention will become apparent from the following description of the embodiments of the invention taken in conjunction with the accompanying drawings.

SUMMARY OF THE INVENTION

In order to overcome the problems of conventional structures as described above, the present invention is to provide a heat transfer structure for use in semiconductor apparatuses where the semiconductor devices are joined through an electric insulating material with a metallic heat sink means, characterized in that a bismuth glass layer is used as said electric insulating material.

Another aspect of the present invention is a heat transfer structure for use in semiconductor apparatuses where the semiconductor devices are joined through an electric insulating material with a metallic heat sink means, characterized in that as said electric insulating materials, a bismuth glass layer is used, and an intermediate layer comprising a metal or metal product or a combination of said metal and said metal product is interposed between said metallic means and said bismuth glass layer so that said intermediate layer is conjugated with said bismuth glass layer.

Still another aspect of the present invention is a semiconductor apparatus where at least one of semiconductor devices is conjugated through an electric insulating material with a metallic heat sink means, characterized in that as said electric insulating material, a bismuth glass layer is used, and an intermediate layer comprising a metal or metal product or a combination of said metal and said metal product is interposed between said metallic means and said bismuth glass layer so that said intermediate layer is conjugated with said bismuth glass layer.

Still another aspect of the present invention is that a semiconductor apparatus comprising a primary circuit section having semiconductor devices and the first metal material loaded with said semiconductor devices, a control circuit section for transferring control signals to said primary circuit section, external input-output terminals to be connected to said primary circuit section and said control circuit section, and the second metal material for transferring the heat generated from said semiconductor devices into the ambient environment, where an electric insulating material is interposed between said first metal material or said external input-output terminals and said second metal material, characterized in that as said electric insulating material, a bismuth glass layer is used, and an intermediate layer comprising a metal or metal product or a combination of said metal and said metal product is interposed between said first metal material or said external input-output terminals and said bismuth glass layer or between said second metal material and said bismuth glass layer so that said intermediate layer is conjugated with said bismuth glass layer.

According to the present invention, when the interconnection means are bonded to the heat sink with a low melting bismuth glass, an intermediate layer comprising a metal or metal product should be interposed between the glass and the metal material, whereby improvement of both thermal properties and reliability can be achieved while retaining a high breakdown voltage. That is, the use of the bismuth glass which may be made very thin allows the heat resistance of the insulating material to reduce and hence the overall heat resistance from the semiconductor devices to the ambient circumstances to reduce. As a result, a current density of the semiconductor devices may be raised, thereby realizing a reduction in the area of the semiconductor devices. Moreover, providing the intermediate layer is advantageous in that it can eliminate the requirement of effecting the bonding in a reducing atmosphere.

DESIGNATION OF REFERENCE NUMBERS

1000 . . . Power module; 1001, 6000, 7000, 8000, 9000, . . . Primary circuit; 1002 . . . Control circuit; 1003a to 1003f . . . IGBT; 1004a to 1004f . . . FWD; 1005 . . . Wire; 1006 . . . Lead-frame; 1007, 2000, 2001, 9001, 9002, 9003 . . . Glass layer; 1008 . . . Heat sink; 1009 . . . Case; 1010, 1019 . . . Connector; 1011 . . . Screw; 1012 . . . Flow path; 1013 . . . Control circuit substrate; 1014 . . . Microcomputer; 1015 . . . Control IC; 1016 . . . Transformer; 1017 . . . Resistance; 1018 . . . Capacitor; 1020 . . . Solder; 5000 . . . Hybrid car system; 5001 . . . Control unit; 5002 . . . Battery; 5003 . . . Motor; 5004 . . . Engine; 5005 . . . Clutch; 5006 . . . CVT; 5007 . . . Wheel axle; 5008 . . . Wheel; 5009 . . . Inverter; 6001 . . . Spacer; 7001, 7002, 7005 . . . Surface irregularities; 7003, 7004 . . . Difference between the top and the bottom of irregularities; 8001 . . . Chromium plate layer; 8002 . . . Chromium oxide layer; 8003 . . . Alumina layer.

DESCRIPTION OF PREFERRED EMBODIMENTS

The present invention will be described in detail in Examples with reference to drawings.

EXAMPLE 1

Figure 1:
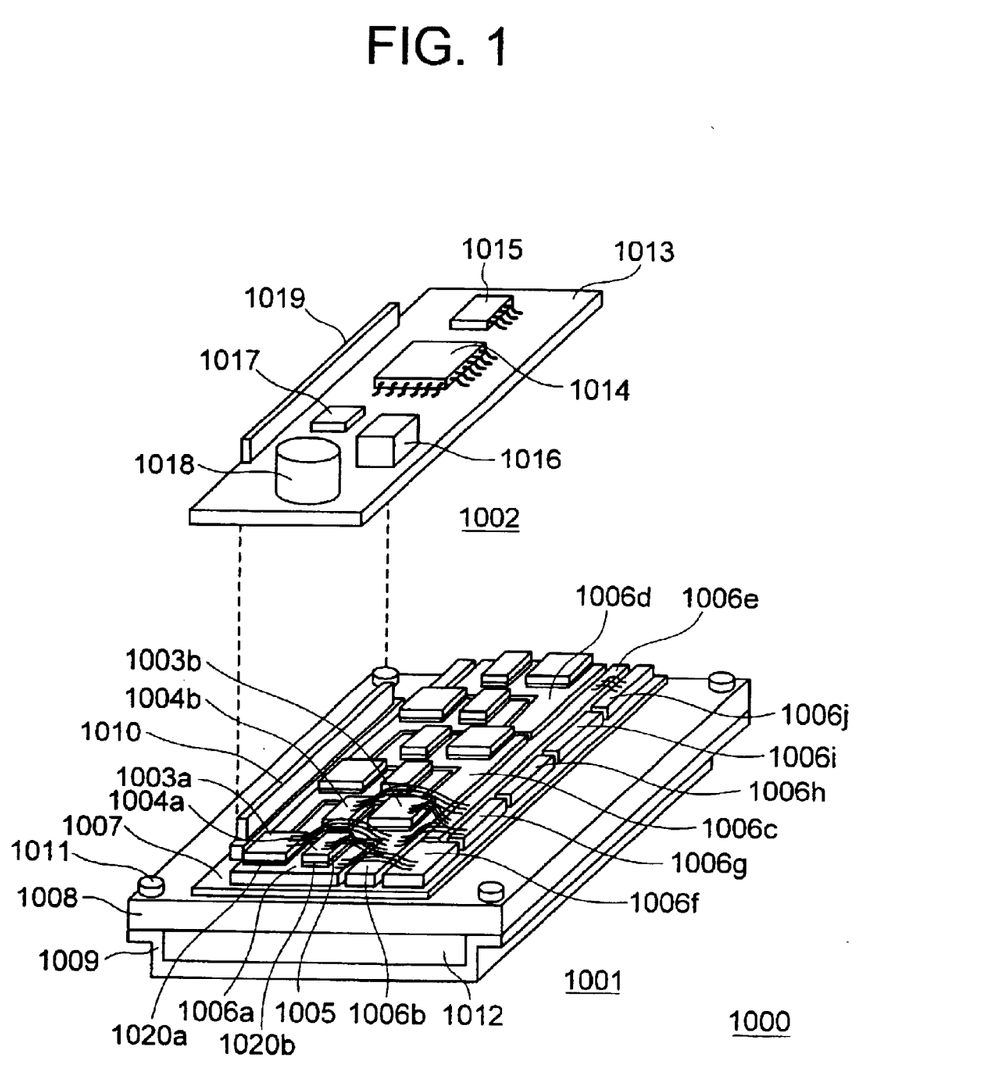
FIG. 1 shows schematic view of a power module with a bismuth glass as an insulating material.
Figure 2:
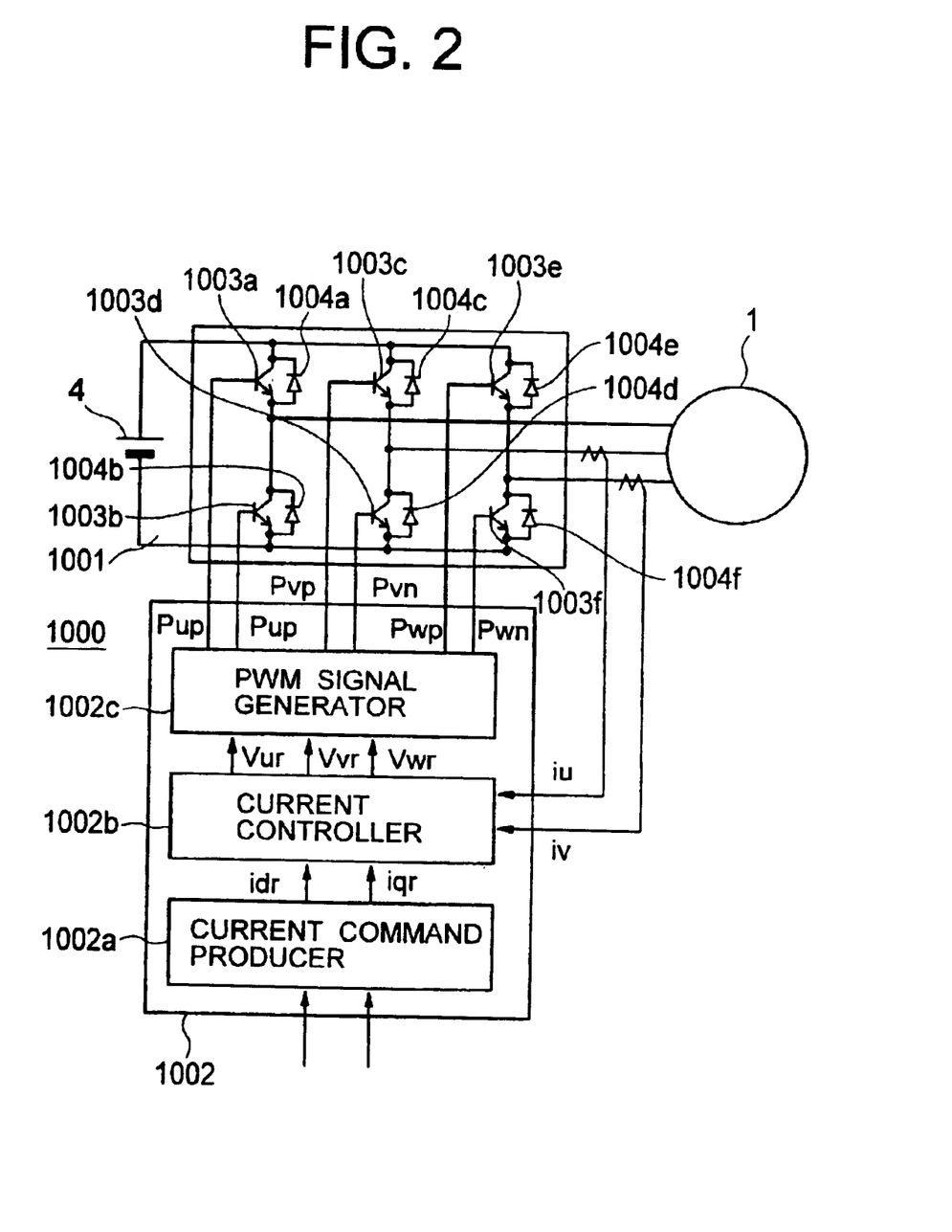
FIG. 2 shows a circuit of a power module as shown in FIG. 1.
Figure 3A:
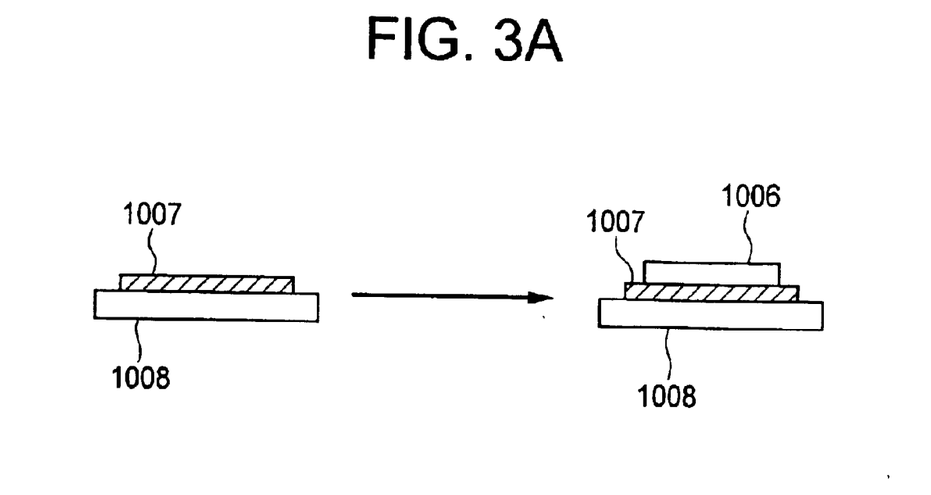
FIGS. 3(a) and 3(b) show schematically a process for bonding a glass onto an interconnection part and a heat sink according to the present invention.
Figure 3B:
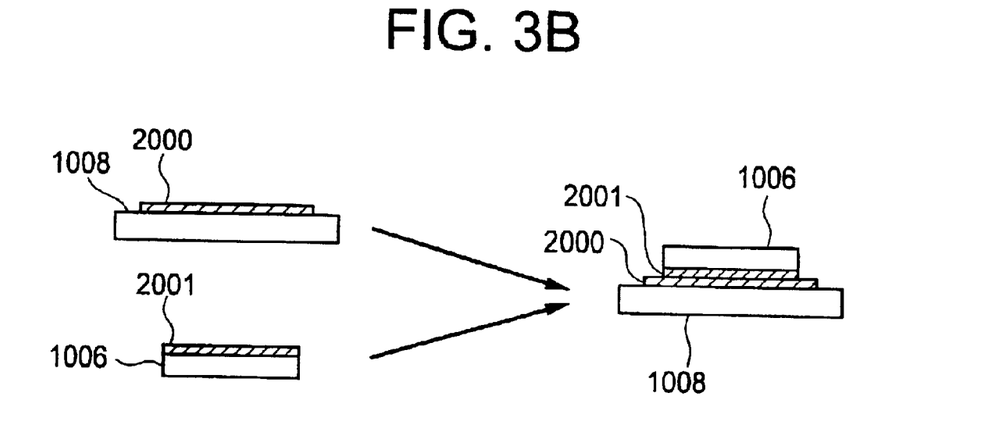
Figure 4:
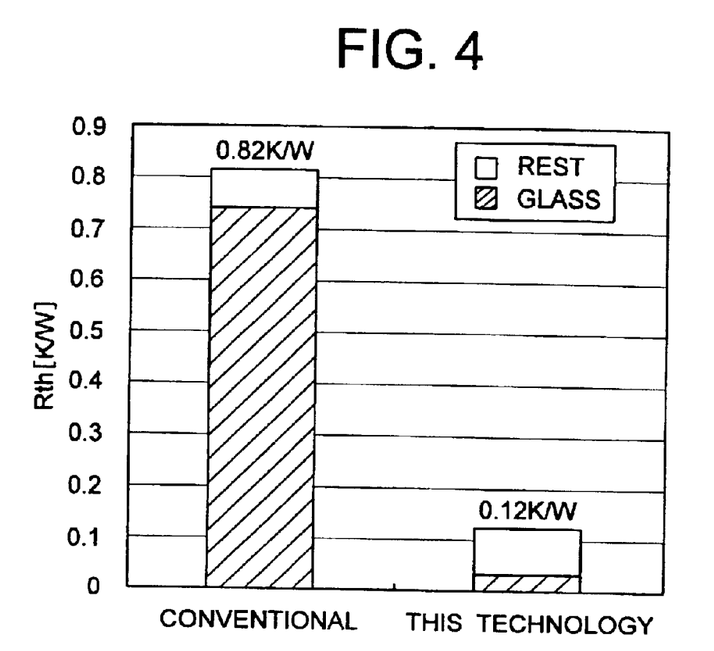
FIG. 4 shows graphs illustrating comparably the heat resistance of the conventional structure and that of the present invention structure.
Figure 5:
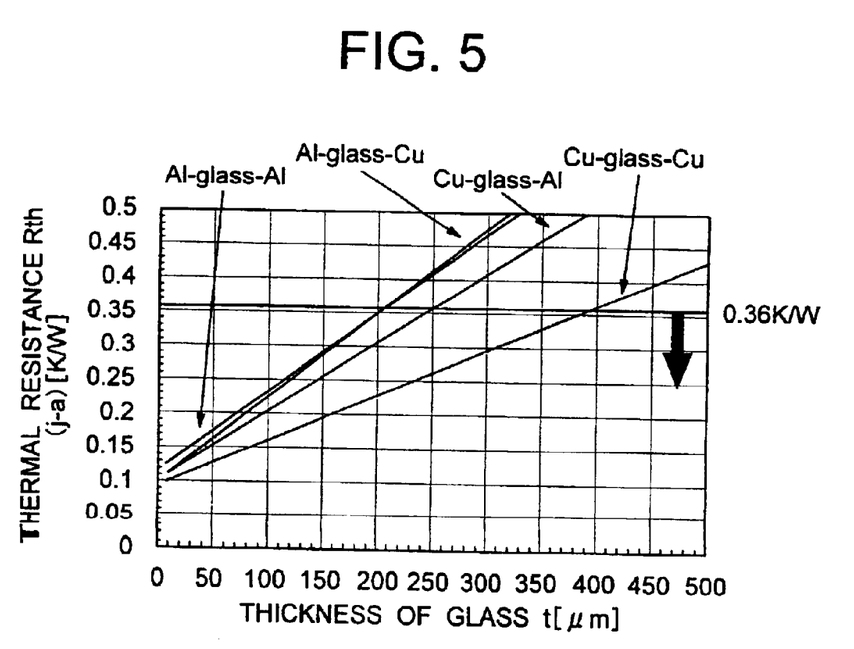
FIG. 5 shows graphs representing the relationship between the thickness and the heat resistance of the glass as a function of material qualities of the interconnection part and the heat sink.

The present invention will be explained with reference to FIGS. 1 to 5 showing a semiconductor apparatus according to the first embodiment of the present invention. FIG. 1 is a schematic view of a semiconductor apparatus, i.e., a power module where a bismuth glass is used as an insulating material. FIG. 2 is a drawing of the circuit of the power module. FIGS. 3(a) and 3(b) are a schematic view illustrating a process for conjugating a glass onto an interconnection means and a heat sink. FIG. 4 shows graphs illustrating comparably the heat resistance of the conventional structure and that of the present invention structure. FIG. 5 shows graphs representing the relationship between the thickness and the heat resistance of the glass as a function of material qualities of the interconnection means and the heat sink.

The arrangement of a three phase power module as a whole according to the first embodiment of the present invention is explained with reference to the perspective view of FIG. 1 and the circuit shown in FIG. 2. Power module 1000 is mainly composed of two parts, i.e., a primary circuit section 1001 and a control circuit section 1002. They are disposed in power electronics apparatuses, e.g., between a motor for driving wheels 1 and a battery 4.

First, the primary circuit section 1001 is explained. IGBT (Insulated Gate Bipolar Transistor) 1003a and FWD (Free Wheeling Diode) 1004a of a U-phase upper arm are loaded via solder 1020a and 1020b on a lead-frame 1006a. IGBT 1003b and FWD 1004b of a U-phase lower arm are loaded on a lead-frame 1006b. The U-phase is composed of IGBTs 1003a, 1003b and FWDs 1004a, 1004b. Similarly, V-phase and W-phase (1003c to 1003f and 1004c to 1004f, respectively) are loaded on the lead-frame 1006a, 1006c, and 1006d.

As switching devices, MOSFET (Metal Oxide Semiconductor/Field Effect Transistor) may be used instead of IGBTs 1003a, 1003b and FWDs 1004a, 1004b.

Lead-frame 1006a, 1006b . . . are interconnection means of semiconductor devices 1003a, 1003b . . . and materials therefor include for example copper, copper alloy, aluminum, or aluminum alloy. IGBT 1003a, 1003b, . . . have dimensions on the order of a 11 mm square, while lead-frame 1006a, 1006b, . . . . are on the order of 120 mm×40 mm×0.7 mm. The collector side of IGBT 1003a is electrically connected with lead-frame 1006a and the emitter sides thereof is connected with lead-frame 1006b via wires 1005. Similarly the anode side of FWD 1004a is electrically connected with lead-frame 1006a and the cathode side thereof is connected with lead-frame 1006b via wires. The wires are depicted only for U phase, though in fact similar interconnections are provided in V and W phases.

Parts of the lead-frame, i.e., P terminal 1006f, N terminal 1006j, U terminal 1006g, V terminal 1006h, and W terminal 1006I are connected to the outside and in most cases bent in a L shape. Gate electrode 1010 is connected via connector 1019 with control circuit substrate 1013. Lead-frame 1006 is connected with heat sink 1008 via glass layer 1007 as insulator. Heat sink 1008 is a flat plate and fixed on a case 1009 by means of screws 1011. The number of the screws in FIG. 1 is four, but it may be in fact more, say as many as ten to avoid any water penetration.

There are formed flow paths 1012 between heat sink 1008 and case 1009, through which paths 1012 a cooling medium, such as water or LLC (Long Life Coolant) liquid flows. Materials for heat sink 1008 and case 1009 include for example aluminum, though both may be made of different metals, like heat sink 1008 of aluminum and case 1009 of aluminum die casting, and then they may be joined with each other. IGBT 1003a, 1003b, and FWD 1004a, 1004b and the like may be sealed with resins by a potting or transfer molding technique or the like.

Now, the arrangement of control circuit section 1002 is described. Control circuit substrate 1013 has a control circuit loaded for driving primary circuit section 1001. This control circuit comprises current command producer 1002a, current controller 1002b, and PWM signal generator 1002c which are composed with microcomputer 1014. This control circuit receives controlling signals, such as driving command signals and motor current signals iu and iv, via connector 1019 from primary circuit section 1001 or externally and after treating the signals, delivers controlling signals to primary circuit section 1001 or the outside again via connector 1019. This is the fundamental arrangement. For treatment of signals, control IC 1015, transformer 1016, resistance 1017, capacitor 1018 and the like are loaded. Control circuit section 1002 is connected with primary circuit section 1001, and then the whole is covered with a housing (not shown) to prevent water penetration.

The present invention is characterized by the arrangement that lead-frame 1006 is combined with heat sink 1008 via bismuth glass layer 1007. A process of combining through bismuth glass layer 1007 lead-frame 1006 with heat sink 1008 is described with reference to FIGS. 3(a) and 3(b). First, a case where lead-frame 1006 and heat sink 1008 are made of aluminum or aluminum alloy is described.

Referring to FIG. 3(a), a bismuth glass layer 1007 is applied on a heat sink in a thickness of 20 μm in an oxidizing atmosphere, such as air. The applying glass layer 1007 is achieved by mixing a glass with a binder (98 wt. % ethanol+2 wt. % ethyl cellulose) to form a glass paste and spraying the paste or printing it. The aforementioned process makes it possible to apply a glass layer having a thickness of at least 5 μm and to control the thickness in the unit of 10 μm. Since low melting aluminum or aluminum alloy is used as materials for heat sink 1008, a bismuth glass, low melting glass can be used as material for glass layer 1007. The glass layer 1007 has a composition of 60% $Bi_2O_3$, 18% $B_2O_3$, 11% Bao, 6% ZnO, 3% CaO, and 2% $SiO_2$ by weight and a glass transition temperature of 438° C., and a thermal expansion coefficient of 10 ppm/° C.

Next, the heat sink 1008 having glass layer 1007 coated thereon is sintered at about 550° C. (in air) (primary sintering) to remove the binder. Thereafter, a lead-frame 1006 is loaded on the glass layer 1007 adhered on the heat sink 1008 and then again sintered at about 550° C. (in air) (secondary sintering) to effect bonding.

Referring to FIG. 3(b), a heat sink 1008 and a lead-frame 1006 are coated with a glass layer 2000 and 2001, respectively, and then the binder is removed. Thereafter, the heat sink 1008 coated with glass layer 2000 is superimposed on the lead-frame 1006 coated with 2001 with both glass layers abutted and then sintered to conjugate them.

The conjugating process of the present invention has advantages in that the process is convenient as shown in FIG. 3(a). Moreover, the conjugated structure of the present invention has advantages in that relaxation of the stress applied on the glass can be achieved and the reliability can be improved as shown in FIG. 3(b). In case the materials for lead-frame 1006 and heat sink 1008 are copper or copper alloy, the sintering is carried out in a reducing atmosphere (in an atmosphere of nitrogen or argon).

The glass components of the aforementioned power module 1000 may be determined with FDX (Energy Dispersion X-ray Spectroscopy or Energy Dispersion Fluorescent X-ray Spectroscopy). In practice, a quantitative analysis may be achieved by cutting a primary circuit section 1001 in a direction transversely across the glass layer 1007 and measuring the cross-section with SEM (Scanning Electron Microscope) to determine the components and ratios of them. In addition, the thickness of the glass layer 1007 can be determined by measuring the cross-section with a conventional optical microscope. When the glass layer 1007 contains light elements, such as B, O, N and the like, a part of the glass layer 1007 is dissolved in an acid solution and subjected to an ICP (Inductively Coupled Plasma Mass Spectroscopy) analysis to determine the components and ratios of them. The temperature of the conjugation may be defined as a temperature when the viscosity of glass is at $10^{-7}$ Pa·s. The viscosity of glass may be evaluated by means of a viscometer.

Specifically, a sample is made according to the ratios of components in the glass composition found by EDX as described above and about 100 grams of the sample is placed in a platinum crucible having a capacity of about 100 cm³. By heating it at about 1000° C., the glass is melted and a viscometer having platinum blades is immersed therein and a revolution rate of the blades and a torque are measured while gradually cooling the melt, whereby the viscosity of glass can be measured.

From the plots of the temperature and the viscosity, the temperature when the viscosity of glass is at $10^{-7}$ Pa·s can be obtained. The thermal expansion coefficient of the glass may be evaluated by means of a differential thermal dilatometer. Similarly to viscosity, the glass composition is formed into a glass block having dimensions of 4 mm long, 4 mm wide, and 15 mm high and a difference in elongation between the glass and the reference quartz ($SiO_2$) is detected with a dilatometer having a differential transformer.

Next, the effect of each component is described under. The $Bi_2O_3$ has an effect to reduce the melting point of the glass. If the content thereof is lower than 40%, the melting point is too high, while if it is higher than 80%, the thermal expansion coefficient is too high. The $Bi_2O_3$ is indispensable to the glass as a glass forming material. If the proportion thereof is too high, the viscosity is too high. BaO, ZnO, CaO, and $SiO_2$ are the components which should be included for stabilizing the glass.

The present invention has advantages as described below. The prior art copper-thick glass-copper structure as disclosed in the invention of Japanese Patent No. 2503778 has a thermal resistance as represented by a left-hand bar graph shown in FIG. 4, while the copper-thin glass-aluminum structure according to the present invention has a thermal resistance as represented by a right-hand bar graph shown in FIG. 4. Both samples used for this analysis had a flat plate heat sink of a thickness of 3 mm and they were tested under conditions of the temperature of the water flowing the flow path at 60° C. and the flow rate at 3 m/s.

The overall thermal resistance from the inside of a semiconductor (chip junction) to the ambient environment (water at 60° C.) (referred to as a total thermal resistance hereunder) is 0.82 K/W for the prior art which indicates the temperature of the chip junction being well over the generally guaranteed temperature (150° C.). This is because the thickness of the glass is as thick as 1 mm and the thermal resistance of the glass layer is at 0.75 K/W comprising 91% of the total thermal resistance as can be seen from the results of finding components of the thermal resistance as shown in FIG. 4.

In contrast, according to the technique of the present invention, the thermal resistance of the glass layer is as low as 0.021 K/W and the total thermal resistance is reduced to 0.12 K/W because the thickness of the glass is as thin as 20 µm. Therefore, the use of the structure according to the present invention allows the temperature of the chip junction to be within the guaranteed temperature. Thus, the greatest advantage of the present technique is that the thermal properties of the power module can be improved by effecting the bonding with a thin glass.

FIG. 5 shows the graphical representation of the thermal properties from the standpoint of glass thickness. With interconnection materials and heat sink materials as parameters, the thermal properties are shown for four cases, copper-glass-copper, copper-glass-aluminum, aluminum-glass copper, and aluminum-glass-aluminum. As the thickness of glass varies, the thermal resistance goes up or down and hence the transverse thermal transfer in the interconnection means varies. The relationship between the thickness of glass and the total thermal resistance is not strictly on a line. However, it is considered that an approximate linear relationship can be well held because the heat may be sufficiently transferred across the interconnection means on the glass layer.

Using FIG. 5, the proper thickness of glass can be determined from the thermal properties. For example, with the copper-glass-aluminum structure, the thickness of the glass layer should be not higher than about 250 µm in order to make the temperature of the chip junction not higher than the guaranteed temperature. With the copper-glass-copper structure, the thickness of the glass layer should be not higher than about 400 µm. With the aluminum-glass-aluminum structure, the thickness of the glass layer should be not higher than about 210 µm. In fact, since there are irregularities on the surfaces of the interconnection means and the heat sink, the thickness of the glass layer may be defined by an average thickness between the interconnection means and the heat sink, it is considered that the thickness of not higher than 500 µm allows the temperature of the chip junction to be within the guaranteed temperature.

By using the structure of the present invention, a high efficient cooling may be realized so that the chip cost comprising a major proportion in the power module cost can be reduced by raising the current density of the chip. By the way, the glass layer has a breakdown voltage on the order of 200 V/µm. When there are no bubbles, nor cracks in the glass layer, it has a breakdown voltage of about 4 kV in the thickness of 20 µm. The breakdown voltage may be determined by contacting a probe on the interconnection means and the heat sink and measuring a current value under a voltage applied.

The secondary advantage of the present invention is that the reliability is improved. Aluminum nitride and alumina to be generally used as insulating materials have a thermal expansion coefficient of 4 ppm/° C. and 7 ppm/° C., respectively, so that they have a large difference in temperature compared with copper having a thermal expansion coefficient of 17 ppm/° C. and alumina of 23 ppm/° C. Glass has generally a thermal expansion coefficient on the order of 5 to 7 ppm/° C. When metals are conjugated through the aforementioned insulating materials, there is a problem that the difference in thermal expansion coefficient causes stresses to generate and the reliability to reduce.

The bismuth glass to be used in the present invention has a thermal expansion coefficient of 10 ppm/° C. It is possible to realize a thermal expansion coefficient of 10 ppm/° C. or more by increasing a proportion of $Bi_2O_3$ or $B_2O_3$. If the thermal expansion coefficient of glass is made to be higher than the 23 ppm/° C. of the thermal expansion coefficient of aluminum, the glass is subjected to a tensile stress so that it may be cracked. The thermal expansion coefficient of glass should be within the range of 10 ppm/° C. to 23 ppm/° C. The use of the bismuth glass reduces the difference in thermal expansion coefficient as compared with those of copper or copper alloy and aluminum or aluminum alloy, so that the reliability of the power module can be enhanced. Moreover, the bismuth glass has an advantage that it can be cheaply produced.

It may be mentioned as the third advantage of the present invention that the bismuth glass has a low melting point. Ordinary glasses have a melting point of 700 to 1000° C. and can not be joined with a lower melting aluminum or aluminum alloy. The bismuth glass used in the technique of the present invention has so low a softening point of 438° C. that it can be bonded with low melting point metals.

The suitability of the bismuth glass to environment may be mentioned as the forth advantage of the present invention. The bismuth glass does not substantially contain lead which is detrimental to environment and allows the structure of the present invention to require only one soldering layer. Owing to this advantage, the bismuth glass may be positively used not only in the field of popular power electronics, but also in the field of vehicles which are benign in the environment, such as electric vehicles and hybrid electric vehicles as shown in FIG. 6.

Figure 6:
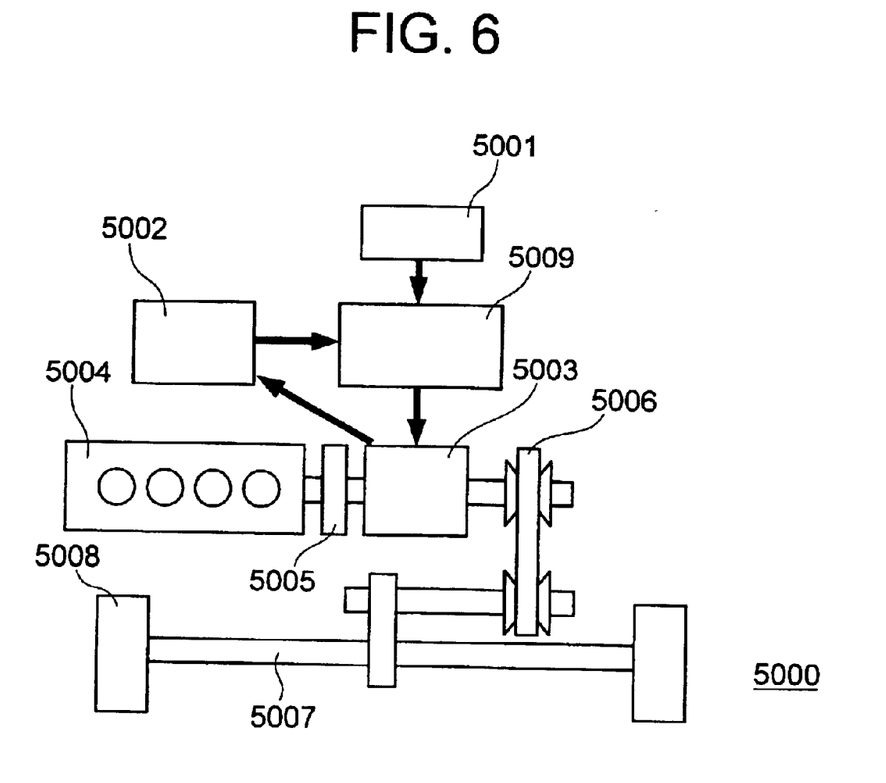
FIG. 6 shows a system arrangement of a hybrid car incorporated with a power module of the present invention.

FIG. 6 shows a system arrangement of a hybrid vehicle according to the present invention. Hybrid vehicle system 5000 employs both engine 5004 and motor 5003, and the driving force is transmitted to wheels 5008 through clutch 5005, CVT (Continuously Variable Transmission) 5006 and axle 5007. Motor 5003 is derived with a power supplied from battery 5002 via inverter 5009. The inverter 5009 is controlled by control unit 5001. Module 1000 and control circuit section 1002 as shown in FIG. 1 correspond to inverter 5009 and control unit 5001, respectively. By improving the thermal properties of power module 1000 according to the present invention, a pump to be used for cooling power module 1000 and motor 5003 can be made smaller, whereby hybrid vehicle system 5000 can be scaled down and the cost of the system can be reduced. The power module of the present invention may be applied to the inverter for electric vehicles with only a motor as an axle driving source.

EXAMPLE 2

Figure 7:
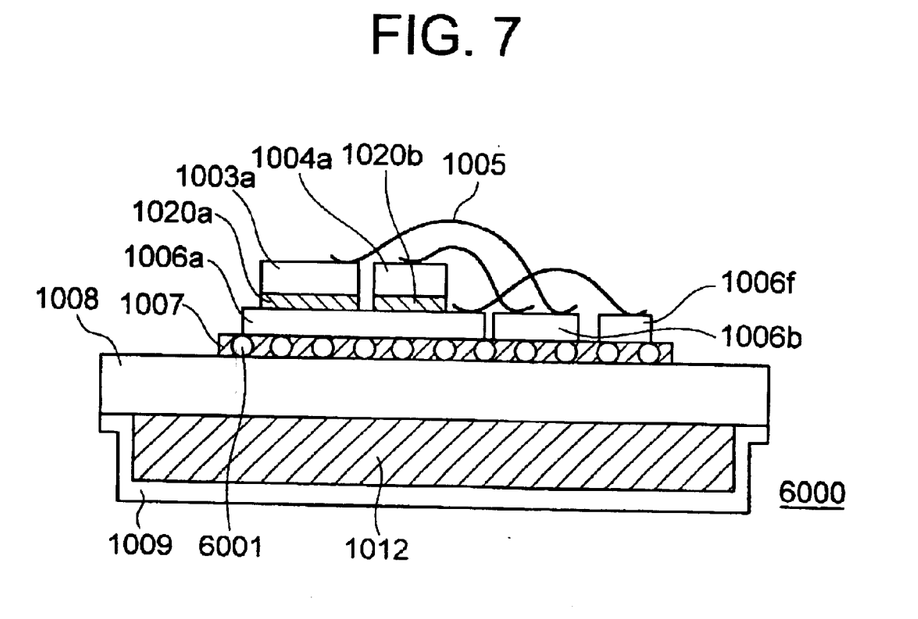
FIG. 7 shows a schematic view of a power module with a combination of the glass and spacer mixed therein according to the present invention.

Next, the second embodiment of the present invention is described with reference to FIG. 7. FIG. 7 is a schematic view of a power module which uses a glass incorporated with spacer. In Example 2, primary circuit section 6000 has the same basic arrangement as that of primary circuit section 1001 shown in FIG. 1, except that glass layer 1007 contains spacer 6001. Spacer 6001 is incorporated for retaining the thickness of glass layer 1007 constant. The spacer is for example composed of $SiO_2$ particles having a size on the order of 20 µm. If the thickness of glass layer 1007 is to be changed, the diameter of spacer 6001 needs only to be changed. By pre-mixing the spacers into the glass, spacer 6001 can be placed on the surfaces of lead-frame 1006 or heat sink 1008 when glass layer 1007 is applied on them. Spacer 6001 is made of a material which is selected from insulating materials having a higher melting point than that of glass layer 1007.

An advantage of incorporating spacer 6001 is an enhancement in breakdown voltage. As the thickness of glass layer 1007 can be made more uniform by using the spacer, the reliability of the insulating property between lead-frame 1006 and heat sink 1008 can be enhanced.

EXAMPLE 3

Figure 8:
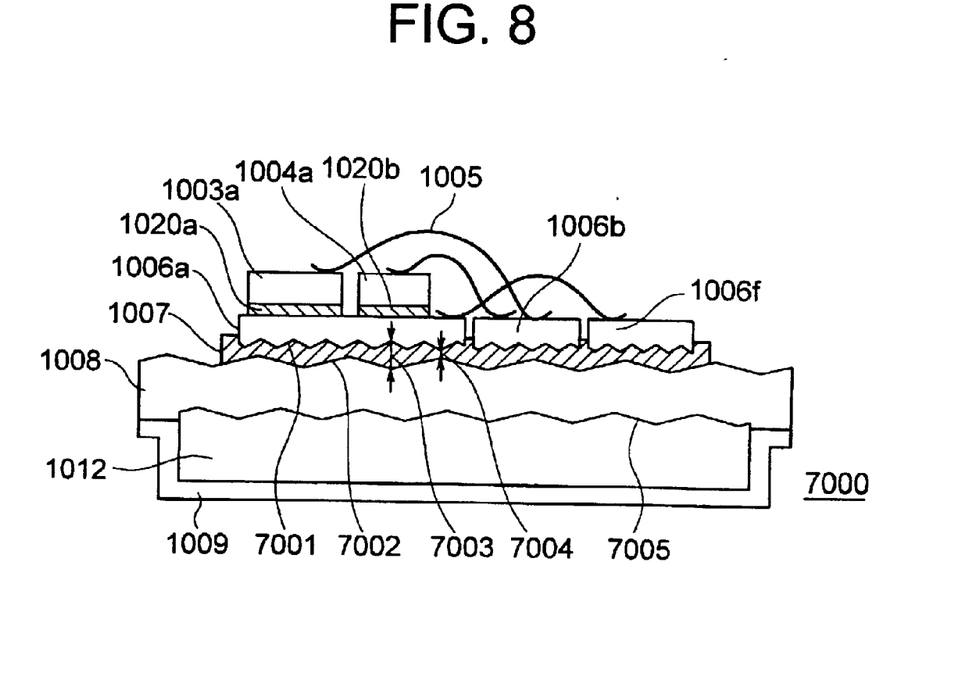
FIG. 8 shows a schematic view of a power module with a lead-frame and the heat sink having irregularities on the surfaces thereof.

Next, the third embodiment of the present invention is described with reference to FIG. 8. FIG. 8 is a schematic view of a power module where the lead-frame and the heat sink have irregularities on the surface. In the third Example, primary circuit section 7000 has the same basic arrangement as that of primary circuit section 1001 shown in FIG. 1, except that lead-frame 1006 and heat sink 1008 have surface irregularities 7001 and 7002, respectively. The irregularities 7001, 7002, shown in FIG. 8 are exaggerated. The actual surface roughness defined as a distance from the top to the bottom of the irregularities is approximetely from several micrometer to several hundreds micrometer. Since the surface roughness of 7001 and that of 7002 are not necessarily the same, the distance between lead-frame 1006 and heat sink 1008 varies similarly from the larger site, such as gap 7003 to the smaller site, such as gap 7004. The thickness of glass layer 1007 must be larger than the irregularities 7003 and 7004, and gap 7004 is required to guarantee the requisite breakdown voltage between lead-frame 1006 and heat sink 1008. Moreover, surface irregularities 7005 are positively formed on the flow path side 1012 of heat sink 1008, whereby the surface area of heat sink 1008 to be contacted with cooling medium is increased to achieve an increase in thermal conductivity between heat sink 1008 and the cooling medium.

Surface irregularities 7003, 7004 and 7005 are formed manually as by sand blasting or etching procedure. From the standpoint of thermal properties, the roughness of surface irregularities 7003 and 7004 should be made smaller in order to make the thickness of glass layer 1007 smaller, while that of surface irregularities 7005 should be made larger in order to increase the thermal conductivity between heat sink 1008 and the cooling medium. Especially the sand blasting procedure can easily achieve varied roughness values of surface irregularities 7003 and 7005. Generally the roughness of surface irregularities 7003 and 7004 are on the order of 5 $\mu$m, while the roughness of surface irregularities 7005 are on the order of 100 $\mu$m.

EXAMPLE 4

Figure 9:
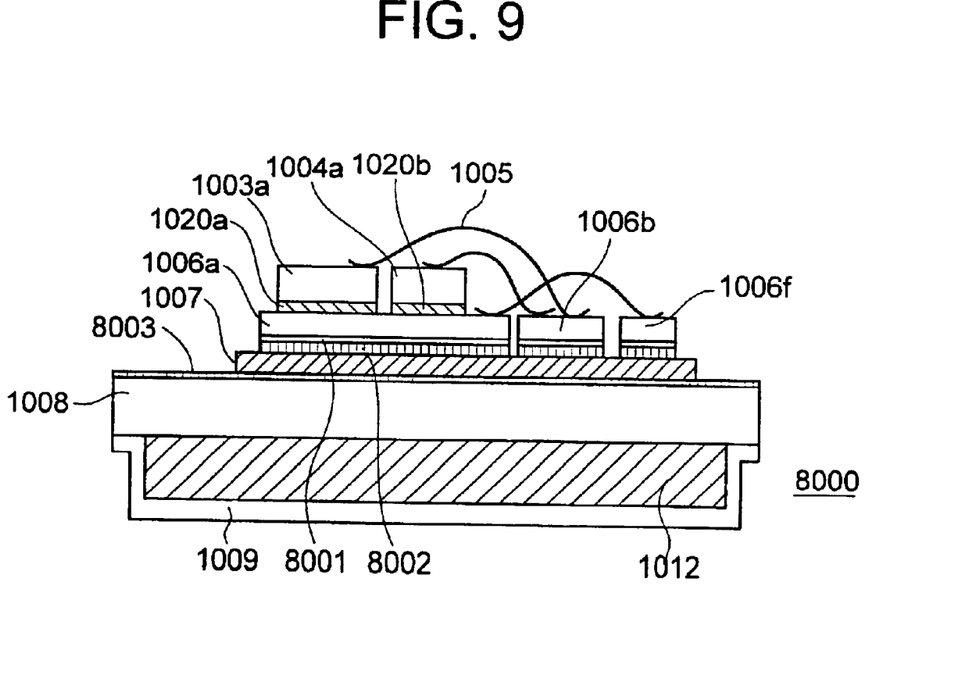
FIG. 9 shows a schematic view of a power module wherein the lead-frame and the heat sink having oxides on the surfaces thereof bonded with the glass.

Next, the forth embodiment of the present invention is described with reference to FIG. 9. FIG. 9 is a schematic view of a power module where the surface oxides of the lead-frame and the heat sink are joined with a glass. In Example 4, primary circuit section 8000 has the same basic arrangement as that of primary circuit section 1001 shown in FIG. 1. Heat sink 1006 is of copper or a copper alloy and heat sink 1008 is aluminum or a aluminum alloy. The surface of lead-frame 1006 is plated with a chromium plate layer 8001 in the thickness of about 1 to 10 $\mu$m. By placing lead-frame 1006 and heat sink 1008 in an oxidizing atmosphere, such as air, chromium oxide layer 8002 and alumina layer 8003 are formed on the surface thereof, respectively. The thickness of alumina layer 8003 is about 1 to 100 nm. Glass layer 1007 is conjugated with lead-frame 1006 and heat sink 1008 by adhering the glass to chromium oxide layer 8002 and alumina layer 8003.

This structure has an advantage that metals for the interconnection means and heat releasing means are not selected. Application of a plating treatment on surfaces allows the oxide of the plate to conjugate with the glass in an oxidizing atmosphere, even if one uses any means which become brittle owing to formation of copper oxides when oxidated, such as copper or a copper alloy. Therefore, there is no need to employ any rigorous reducing atmosphere for glass so that the reliability of glass layer 1007 can be enhanced.

EXAMPLE 5

Figure 10:
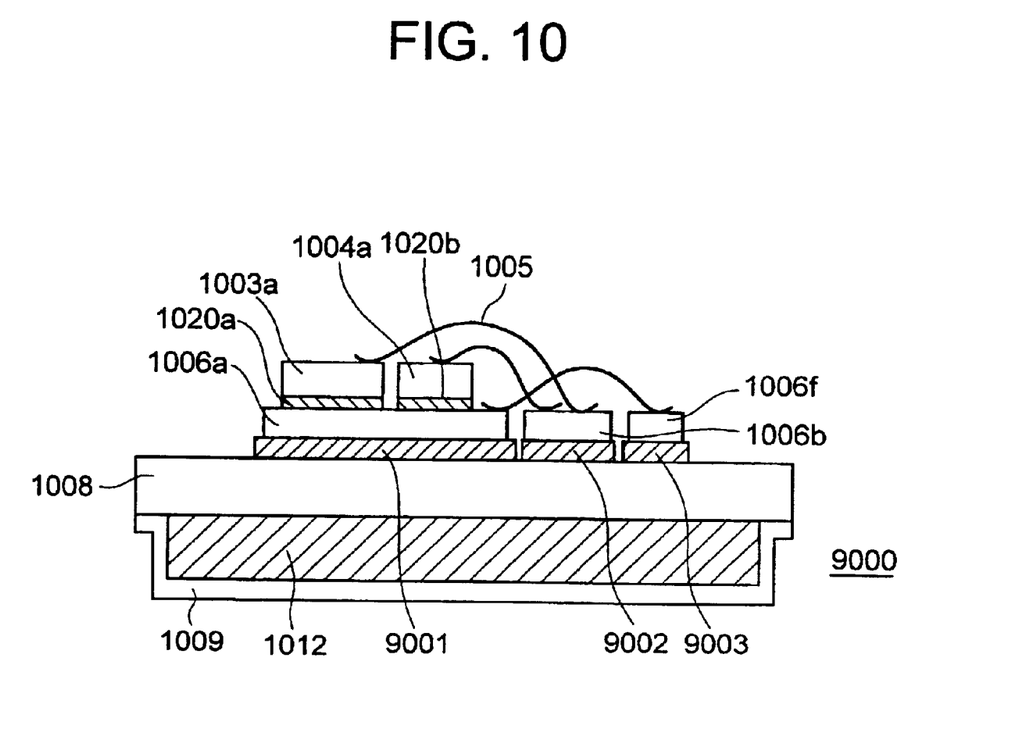
FIG. 10 shows a schematic view of a power module wherein the glass was provided only on the location on which the lead-frame is loaded.

Next, the fifth embodiment of the present invention is described with reference to FIG. 10. FIG. 10 is a schematic view of a power module where a glass layer is provided only on the site to be loaded with a lead-frame. In Example 5, primary circuit section 9000 has the same basic arrangement as that of primary circuit section 1001 shown in FIG. 1, except that a glass layer is provided only on the bottom surface of heat sink 1006. In the process for conjugating a glass as shown in FIG. 3($a$), heat sink 1008 is covered with a mask (not shown) and then bonded to the glass so that the glass is conjugated to only predetermined sites where lead-frame 1006 is loaded. Thereafter, on the bonded glass layers 9001, 9002 and 9003, lead-frame 1006 is placed and adhered. Even in the process shown in FIG. 3($a$), heat sink 1008 is covered with a mask (not shown) and then conjugated with a glass. It is conjugated to the lead-frame 1006 which has been previously conjugated with a glass. Glass layers 9001, 9002 and 9003 must be larger than lead-frame 1006 by about 1 mm in order to avoid discharge along the surfaces.

This structure has an advantage that the reliability of glass layers 9001, 9002 and 9003 can be enhanced. By bonding only a part of each glass layer 9001, 9002 or 9003, stresses produced by a difference in thermal expansion coefficient between the glass and lead-frame 1006 or heat sink 1008 can be reduced.

Advantages of the Present Invention

According to the present invention, the use of bismuth glass as insulating material which can be made thinner allows a reduction in thermal resistance of insulating material as well as a reduction in the total thermal resistance from semiconductor devices to the ambient environment. As a result, the density of semiconductor devices can be increased so that a reduction in the area of semiconductor devices can be realized. Moreover, by providing an intermediate layer, requirement of bonding in a reducing atmosphere can advantageously be eliminated. Moreover, the bismuth glass can be conjugated with low melting metals and it contains substantially no lead, so that it can realize that the flexibility of designing power modules and the versatility of application are enhanced.

It should be further understood by those skilled in the art that the foregoing description has been made on embodiments of the invention and that various changes and modifications may be made in the invention without departing from the spirit of the invention and the scope of the appended claims.

What is claimed is:

1. A vehicle comprising:
   a motor for driving an axle directly connected to wheels;
   an inverter for controlling a driving force of said motor and including at least one semiconductor apparatus having a heat transfer structure in which semiconductor devices are conjugated with a heat releasing metal via an electric insulating material which is a bismuth glass layer; and
   a battery for driving said inverter or recovering a power from said motor.

2. The vehicle according to claim 1, wherein the heat transfer structure further comprises an intermediate layer comprising a metal or metal product or a combination of said metal and said metal product provided between said heat releasing metal and said bismuth glass layer, wherein said bismuth glass layer and said intermediate layer are conjugated to each other.

3. The vehicle according to claim 1, wherein said bismuth glass layer contains bismuth in an amount of about 30% to 80% by weight measured as $Bi_2O_3$ on the basis of said glass.

4. The vehicle according to claim 1, wherein said glass has a thermal expansion coefficient of about 10 to 23 ppm/° C. inclusive.

5. The vehicle according to claim 1, wherein a lead-frame of said semiconductor devices is conjugated with said heat releasing metal via said electric insulating material.

6. An inverter vehicle comprising:

a motor for driving an axle directly connected to wheels;

an inverter for controlling a driving force of said motor and having at least one semiconductor apparatus including a primary circuit section having semiconductor devices disposed on a first metal material, a control circuit section for transmitting control signals to said primary circuit section, and external input-output terminals to be connected to said primary circuit section and said control circuit section, a second metal material for exchanging heat generated from said semiconductor devices into the ambient environment, an electric insulating material interposed between said first metal material or said external input-output terminals and said second metal material, said electric insulating material being a bismuth glass layer, and an intermediate layer comprising a metal or metal product or a combination of said metal and said metal product interposed between said first metal material or said external input-output terminals and said bismuth glass layer, and between said second metal material and said bismuth glass layer, said intermediate layer being conjugated with said bismuth glass layer; and a battery for driving said inverter or recovering a power from said motor.

7. The inverter vehicle according to claim 6, wherein said first metal material and said second metal are different from each other.

8. The inverter vehicle according to claim 6, wherein said electric insulating material comprises spacers for keeping a distance between said first metal material and said second metal material uniform.

9. The inverter vehicle according to claim 6, wherein each of said first metal material, said external input-output terminals, and said second metal material has a surface roughness that is smaller than a thickness of said electric insulating material.

10. The inverter vehicle according to claim 6, wherein a thickness of said insulating material is not higher than a predefined thickness t0, to being defined as a thickness of said insulating material which results in a temperature of a junction of said semiconductor devices being equal to an upper temperature limit for said semiconductor devices, the temperature of the junction being determined by a thermal resistance from said junction to an ambient environment, an exothermic heat from said semiconductor devices, and an environmental temperature.

11. The inverter vehicle according to claim 10, wherein both said first metal material and said second metal material are copper or a copper alloy, and said t0=400 μm.

12. The inverter vehicle according to claim 10, wherein said first metal material is copper or a copper alloy, and said second metal material is aluminum or an aluminum alloy, and t0=250 μm.

13. The inverter vehicle according to claim 10, wherein both said first metal material and said second metal material are aluminum or an aluminum alloy, and said t0=210 μm.

* * * * *